(12) United States Patent
Channabasappa et al.

(10) Patent No.: US 10,095,474 B2
(45) Date of Patent: Oct. 9, 2018

(54) FILLER BANK CONTROL CIRCUIT FOR SYNCHRONOUS FIFO QUEUES AND OTHER MEMORY DEVICES

(71) Applicant: Texas Instruments Incorporated, Dallas, TX (US)

(72) Inventors: Rakesh Yaraduyathinahalli Channabasappa, Bangalore (IN); Shekhar Dinkar Patil, Bangalore (IN); Rajeev Suvarna, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 581 days.

(21) Appl. No.: 14/270,165

(22) Filed: May 5, 2014

(65) Prior Publication Data
US 2015/0317087 A1   Nov. 5, 2015

(51) Int. Cl.
*G06F 3/06* (2006.01)
*G06F 5/10* (2006.01)
*G11C 8/16* (2006.01)

(52) U.S. Cl.
CPC ............ *G06F 5/10* (2013.01); *G06F 3/0613* (2013.01); *G06F 3/0659* (2013.01); *G06F 3/0673* (2013.01); *G11C 8/16* (2013.01)

(58) Field of Classification Search
CPC . G11C 7/1006; G11C 29/36; G11C 2207/104; G11C 2029/3602; G11C 29/40
See application file for complete search history.

(56) References Cited

U.S. PATENT DOCUMENTS

| | | | | |
|---|---|---|---|---|
| 5,278,956 A | * | 1/1994 | Thomsen | G06F 5/10 711/167 |
| 6,201,451 B1 | * | 3/2001 | Hata | H04L 27/2014 332/100 |
| 6,850,340 B1 | * | 2/2005 | Ohshita | H04N 1/393 358/1.2 |
| 7,454,324 B1 | * | 11/2008 | Seawright | G06F 17/5022 703/14 |
| 7,934,038 B1 | | 4/2011 | Kao et al. | |
| 2007/0016826 A1 | * | 1/2007 | Dubey | G11C 29/003 714/30 |
| 2008/0013389 A1 | | 1/2008 | Kim et al. | |
| 2008/0028125 A1 | * | 1/2008 | Bartley | G06F 13/1684 711/100 |
| 2010/0299508 A1 | | 11/2010 | Luttrell | |

* cited by examiner

*Primary Examiner* — Kyle Vallecillo
(74) *Attorney, Agent, or Firm* — Gregory J. Albin; Charles A. Brill; Frank D. Cimino

(57) ABSTRACT

An apparatus includes a controller and logic circuitry. The controller is configured to generate multiple single-bit logic values. Each single-bit logic value has one of (i) a first value indicating that a data packet has been written into a memory and (ii) a second value indicating that a data packet has been read from the memory. The logic circuitry is configured to serially stack the single-bit logic values. The apparatus could further include a shift memory bank configured to store the single-bit logic values. The logic circuitry can be configured to serially stack the single-bit logic values in the shift memory bank. For example, the logic circuitry can be configured to shift the single-bit logic values in the shift memory bank in different directions and insert one single-bit logic value into the memory bank at different ends depending on whether the one logic value has the first or second value.

18 Claims, 5 Drawing Sheets

FILLER BANK CONTROL CIRCUIT FOR SYNCHRONOUS FIFO QUEUES AND OTHER MEMORY DEVICES

TECHNICAL FIELD

This disclosure is generally directed to data storage and retrieval. More specifically, this disclosure is directed to a filler bank control circuit for synchronous first in, first out (FIFO) queues and other memory devices.

BACKGROUND

Digital logic circuits associated with a memory storage unit can record the transfer of data, commands, or any other information (referred to as "data packets") with one or more other devices. Data transfer rates can differ between inserting data packets into a memory storage unit and extracting data packets from the memory storage unit.

A control circuit associated with managing data packet insertion and extraction into and out of a memory storage unit can use write and read pointers to address memory storage unit locations. The write pointer increments and points to a subsequent address location of the memory storage unit after each data packet insertion into the memory storage unit. The read pointer similarly increments and points to a subsequent address location of the memory storage unit after each data packet extraction from the memory storage unit. The control circuit compares values of the read and write pointers to track the occupancy of the memory storage unit. Based on the comparison, the control circuit can generate a signal such as a "queue is empty" signal or a "queue is full" signal to indicate whether to continue with a data packet insertion or extraction operation. If the queue is full, the data packet insertion operation by an associated circuit will stop its write operation/data packet insertion. Similarly, if the queue is empty, the associated circuit will stop the read operation/data packet extraction.

The implementation of the control circuit can limit the data rate at which insertions and extractions of data packets can operate. For conventional first in, first out (FIFO) queues, which can have a larger "depth" of the memory storage unit, the sizes of the read and write pointers and comparators in the control circuit can increase proportionally. With the increase in comparator size, the insertion and extraction data rates can be even further reduced. This decreases the operating frequency and throughput of the memory storage unit.

SUMMARY

This disclosure provides a filler bank control circuit for synchronous first in, first out (FIFO) queues and other memory devices.

In a first example, an apparatus includes a controller and logic circuitry. The controller is configured to generate multiple single-bit logic values. Each single-bit logic value has one of (i) a first value indicating that a data packet has been written into a memory and (ii) a second value indicating that a data packet has been read from the memory. The logic circuitry is configured to serially stack the single-bit logic values.

In a second example, a method includes generating multiple single-bit logic values and serially stacking the single-bit logic values. Each single-bit logic value has one of (i) a first value indicating that a data packet has been written into a memory and (ii) a second value indicating that a data packet has been read from the memory.

In a third example, a system includes a memory, a write counter, a read counter, a controller, and logic circuitry. The write counter is configured to generate an indication that a data packet has been written into the memory. The read counter is configured to generate an indication that a data packet has been read from the memory. The controller is configured to generate single-bit logic values having a first value in response to the indications from the write counter and single-bit logic values having a second value in response to the indications from the write counter. The logic circuitry is configured to serially stack the single-bit logic values.

In particular implementations, a "queue is full" signal can be generated based on a top-stacked single-bit value, and a "queue is empty" signal can be generated based on a bottom-stacked single-bit value.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various examples used to describe the principles of the present invention in this patent document are by way of illustration only and should not be construed in any way to limit the scope of the invention. Those skilled in the art will understand that the principles of the present invention can be implemented in any suitable manner and in any type of suitably arranged device or system.

Figure 1:
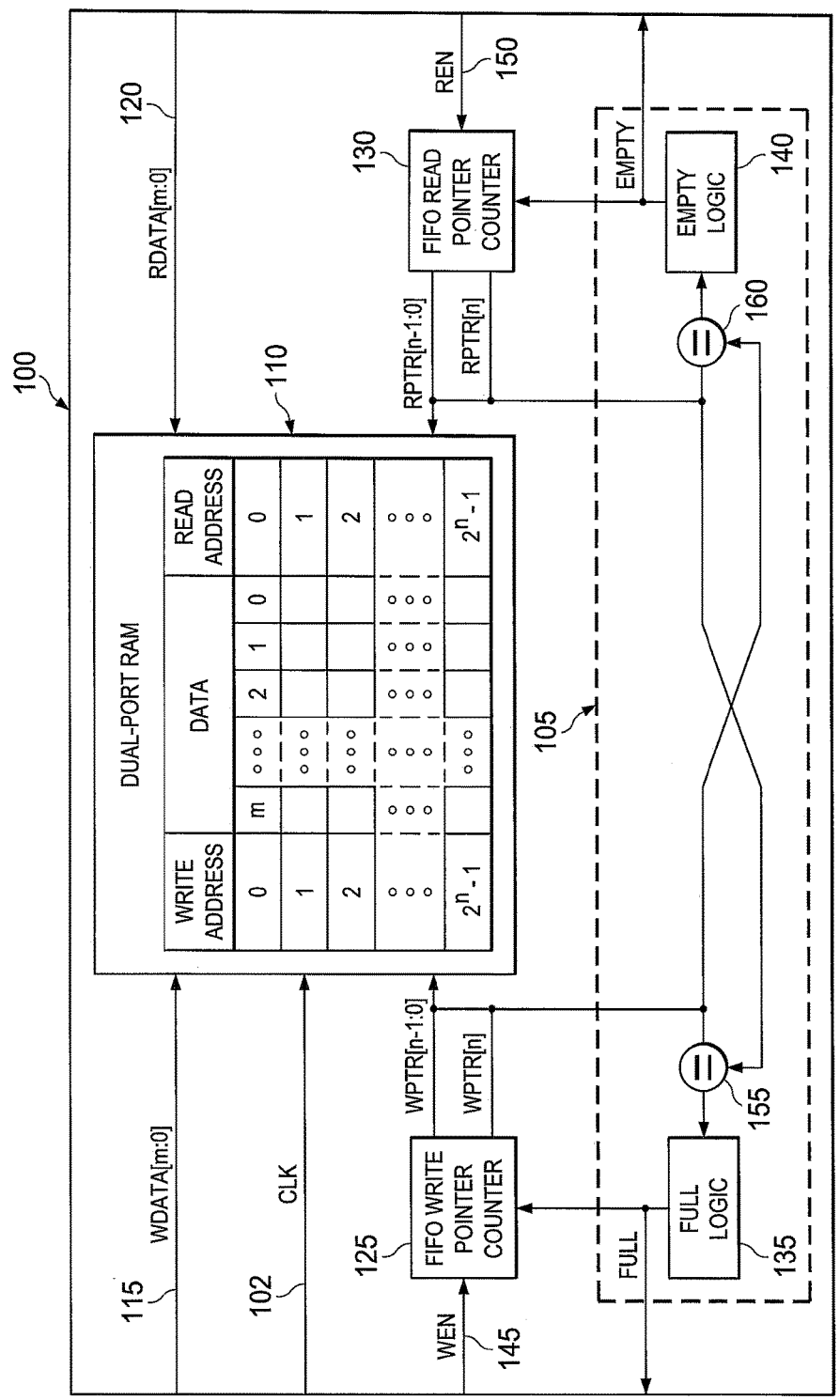
FIG. 1 illustrates an example of a conventional memory control circuit.

FIG. 1 illustrates an example of a conventional memory control circuit 100. In this example, the memory control circuit 100 includes a first in, first out (FIFO) memory and control circuit. Note, however, that data packets can be written to the memory and read from the memory according to any other suitable mechanism.

As shown in FIG. 1, the circuit 100 includes a control circuit 105 and a memory 110. In this example, the memory 110 represents a random access memory (RAM) having a data input port 115 (for write data) and a data output port 120 (for read data). The memory 110 can be clocked by a clock signal 102. The memory 110 could represent any suitable type of memory structure, such as a first in, first out (FIFO) queue.

The control circuit 105 here includes a write counter 125 (such as a FIFO write pointer counter), a read counter 130 (such as a FIFO read pointer counter), a full logic component 135, an empty logic component 140, a full logic comparator 155, and an empty logic comparator 160. The write counter 125 has a write enable input 145, and the read counter 130 has a read enable input 150. The write counter 125 counts the number of data packets that enter (are written into) the memory 110, and the read counter 130 counts the number of data packets that leave (are read from) the memory 110. An output of the write counter 125 (such as a location in the memory 110 indicated by a write pointer) can be provided to inputs of the comparator 155, the comparator 160, and the memory 110. An output of the read counter 130 (such as a location in the memory 110 indicated by a read pointer) can be provided to inputs of the comparator 155, the comparator 160, and the memory 110.

The full counter comparator 155 provides an input to the full logic component 135, and the empty counter comparator 160 provides an input to the empty logic component 140. However, with this system, the comparison of read and write pointers can limit the operating frequency and throughput of the memory 110. This could be due to various factors, such as the sizes of the read and write pointers and the logic sizes of the comparators 155 and 160.

Moreover, the empty logic component 140 is configured to provide an indication that the memory 110 is empty. For example, the empty counter comparator 160 can compare the data packet count of the read counter 130 with the data packet count of the write counter 125. The empty counter comparator 160 can also transmit a signal to the empty logic component 140 when the data packet counts of the read counter 130 and the write counter 125 are the same. The empty logic component 140 can be configured to provide an "empty" memory condition in response to receiving such a signal from the empty counter comparator 160.

Similarly, the full logic component 135 is configured to provide an indication that the memory 110 is full or not empty. For example, the full counter comparator 155 can compare the data packet count of the read counter 130 with the data packet count of the write counter 125. The full counter comparator 155 can also transmit a signal to the full logic component 135 when the data packet counts of the read counter 130 and the write counter 125 are not the same. The full logic component 135 can be configured to provide a "full" (or "not empty") memory condition in response to receiving such a signal from the full counter comparator 155.

The performance and throughput of a FIFO queue can be determined based on the speed and operation of the comparators 155, 160 and the control circuit 105. As the depth of the memory 110 increases, the sizes of the read and write pointers increases. As a result, the sizes of the comparisons made by the comparators 155, 160 can increase, which can degrade the operating frequency and throughput of the memory 110.

Figure 2:
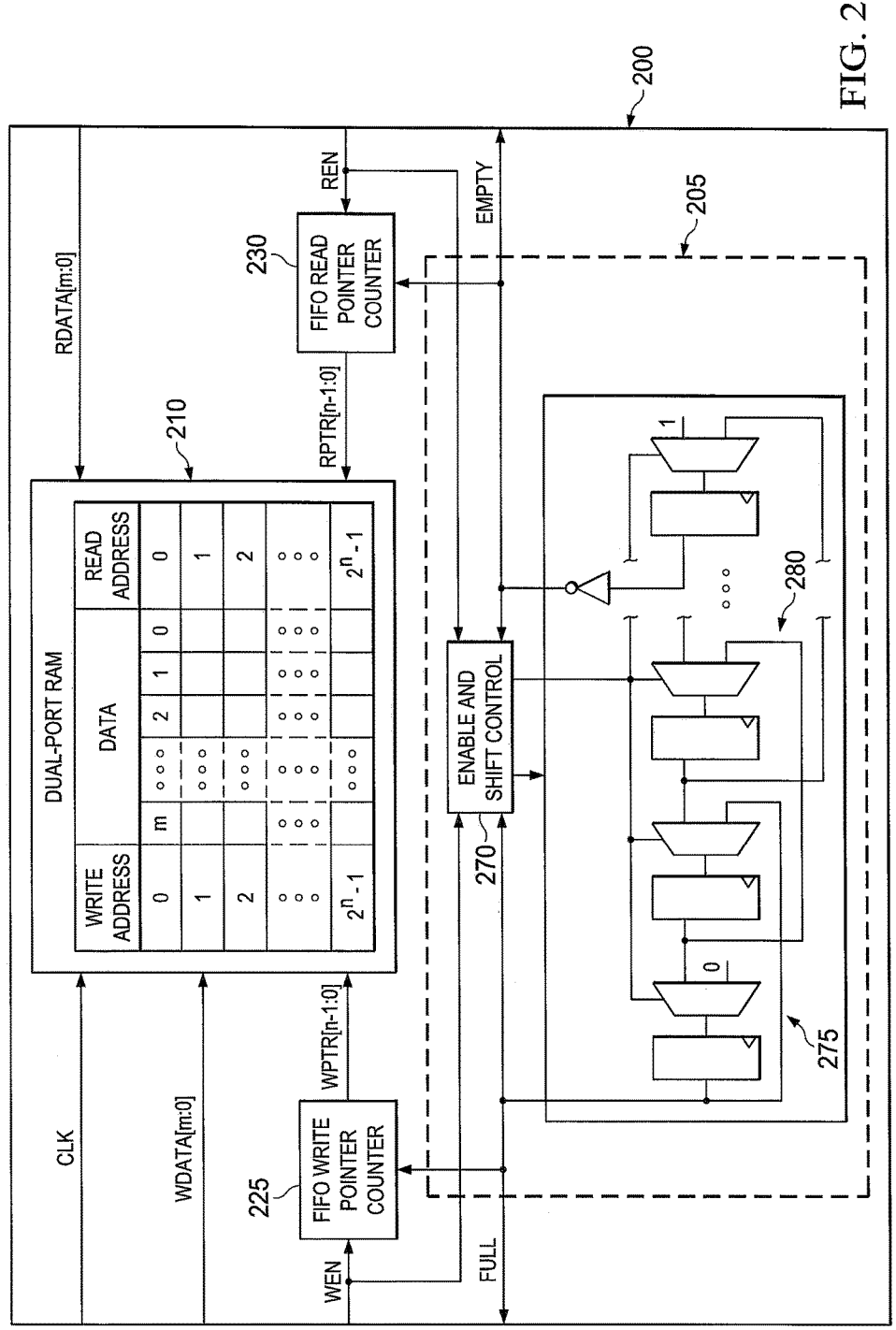
FIG. 2 illustrates an example of a filler bank control circuit for synchronous FIFO queues according to this disclosure.

FIG. 2 illustrates an example of a filler bank control circuit 200 for synchronous FIFO queues according to this disclosure. In this example, the control circuit 200 includes a FIFO memory and a control circuit. Note, however, that data packets can be written to the memory and read from the memory according to any other suitable mechanism. For example, the memory 210 can utilize a First-In, First Out (FIFO) memory usage model, a Last-In, First-Out (LIFO) memory usage model, a stack buffer memory usage model, or the like. In some embodiments, the control circuit 200 represents a ($2^n-1$)-level deep synchronous FIFO binary memory control circuit.

As shown in FIG. 2, the circuit 200 includes a control circuit 205 and a memory 210. The memory 210 in this example represents a dual-port RAM, although any other suitable memory device could be used. The control circuit 205 includes a write counter 225 (such as a FIFO write pointer counter) and a read counter 230 (such as a FIFO read pointer counter). The control circuit 205 also includes an enable and shift control unit 270 (referred to as "controller 270"), logic circuitry 275, and a filler bank 280.

The controller 270 receives an indication from the write counter 225 when a data packet has been written into the memory 210. For example, for each data packet written into the memory 210, the controller 270 could be configured to transmit a "1" or logic high value to the logic circuitry 275. The controller 270 also receives an indication from the read counter 230 when a data packet has been read from the memory 210. For example, for every data packet read from the memory 210, the control component could be configured to transmit a "0" or logic low value to the logic circuitry 275.

The controller 270 therefore transmits a single bit based on receiving an indication that a data packet is written into the memory 210 (such as transmitting a "1" value) or a single bit based on receiving an indication that a data packet is read from the memory 210 (such as transmitting a "0" value). In this way, instead of comparing numerous bits associated with write pointer locations and read pointer locations, the control circuit 205 operates using single-bit indicators. This can help to reduce limitations placed on the operating frequency and throughput of the memory 210.

In some embodiments, a data packet can be written into the memory 210 at the same time (or at substantially the same time) that a data packet is read from the memory 210. In this case, both the write counter 225 and the read counter 230 can transit an indication to the controller 270 at the same time (or at substantially the same time) or within a specified amount of time. When this occurs, the controller 270 can determine that multiple indications were received at or near the same time or within the specified amount of time. In particular embodiments, in response to such a determination, the controller 270 can refrain from sending either a logic low value or a logic high value to the logic circuitry 275. In other particular embodiments, the controller 270 can send two single bit values (one high and one low) to the logic circuitry 275 when read and write operations occurred at or near the same time.

Furthermore, the controller 270 could receive an uneven number of indications from the write counter 225 and the read counter 230 within a specified amount of time, and the controller 270 can be configured to ignore pairs of indicators (one from the write counter 225 and one from the read counter 230). For example, the controller 270 could receive two indications from the write counter 225 and three indications from the read counter 230 within the specified amount of time. In this case, the controller 270 can be configured to ignore two pairs of write and read counter indicators, and the controller 270 transmit only a single logic low value to the logic circuitry 275 (since it received one unmatched indication from the read counter 230). As another example, the controller 270 could receive four indications from the write counter 225 and two indications from the read counter 230 within the specified amount of time. In that case, the controller 270 can be configured to ignore two pairs of write and read counter indicators and transmit two logic high values to the logic circuitry 275 (since it received two unmatched indications from the write counter 225). Note, however, that the controller 270 need not cancel pairs of write and read indications and could transmit a single bit value to the logic circuitry 275 for each read and write operation identified by the counters 225-230.

The filler bank 280 represents a shift memory bank containing slots that are configured to store the single-bit logic values received from the controller 270. The number of slots within the filler bank 280 can be indicative of the number of memory storage levels in the memory 210. For example, the memory 210 can comprise thirty-two levels for storing data packets. Similarly, the filler bank 280 can include thirty-two slots in the shift memory bank indicative of the thirty-two levels in the memory 210 for storing data packets. Thus, when data packets are written into all thirty-two levels of the memory 210, all thirty-two slots within the filler bank 280 can store single-bit logic values indicating that a data packet has been written every level of the memory 210.

The logic circuitry 275 is configured to shift single-bit logic values within the filler bank 280. The values in the filler bank 280 can indicate the data occupancy in the memory 210. As a result, shifting values within the filler bank 280 can update the data occupancy of the memory 210 as read and write operations occur. For example, assuming a four-level deep memory, when no data packets have been written into the memory 210, the logic circuitry 275 can store bits "0 0 0 0" in the filler bank 280, indicating that no data packets have been written into the memory 210. It should be understood that an empty memory 210 can include a memory that has no data packets written into the memory 210 that have not already been read out of the memory 210 (even if the memory 210 still contains the contents of those data packets that have been stored and read).

The filler bank 280 supports the serial shifting or serial stacking of single bit data values. Serially shifting or serially stacking can include arranging single-bit logic values into a sequential order or arrangement. When a first data packet is written into the memory 210, the controller 270 transmits a "1" or logic high value to the logic circuitry 275, which receives the logic high value and determines that the value is a logic high value. Upon receiving the value and determining that the value is a logic high value, the logic circuitry 275 serially shifts the filler bank 280 to the left and inserts the logic high value into the right end of the filler bank 280. At this point, the filler bank 280 contains a value of "0 0 0 1," which indicates that one data packet has been written into one level of the memory 210 but that the other three levels are empty. The memory 210 therefore has a queue depth of one or is 25% full.

When a second data packet is written into the memory 210, the logic circuitry 275 receives a second logic high value from the controller 270, serially shifts the filler bank 280 to the left, and inserts the second logic high value on the right end of the filler bank 280. The filler bank 280 therefore stores a value of "0 0 1 1," which indicates that data packets have been written into two levels of the memory 210 but that the other two levels are empty. Thus, the memory 210 has a queue depth of two or is 50% full.

When a data packet is read from the memory 210, the controller 270 transmits a "0" or logic low value to the logic circuitry 275. The logic circuitry 275 receives the logic low value and determines that the value is a logic low value. Upon receiving the value and determining that the value is a logic low value, the logic circuitry 275 serially shifts the filler bank 280 to the right and inserts the logic low value into the left end of the filler bank 280. Assuming the filler bank 280 currently contains a value of "0 0 1 1," a receipt of a logic low value causes the logic circuitry 275 to operate the filler bank 280 so that the filler bank 280 now contains a value of "0 0 0 1." This indicates that one data packet has been read from one level of the memory 210 but that another data packet has not been read from a level of the memory 210. This also indicates that three levels of the memory 210 are again empty and the memory 210 has a queue depth of one or is 25% full.

When a second data packet is read from the memory 210, the logic circuitry 275 receives a second logic low value from the controller 270, serially shifts the filler bank 280 again to the right, and inserts another logic low value on the left end of the filler bank 280. At this point, the filler bank 280 stores a value of "0 0 0 0." As a result, four levels of the memory 210 are empty, and the memory 210 has a queue depth of 0 or is 0% full.

As can be seen here, the logic circuitry 275 serially stacks both the "0" and "1" values, but the values are stacked in different directions. More specifically, the logic circuitry 275 serially stacks the "1" values from right to left in the filler bank 280, and the logic circuitry 275 serially stacks the "0" values from left to right in the filler bank 280. The end result is that the depth of the memory 210 is identified by the left-most "1" bit position in the filler bank 280.

The logic circuitry 275 can also be configured to provide an indication of the depth of the memory 210 to another device or system, such as a queue manager that manages multiple memories similar to the memory 210, a data terminal for viewing by an administrator, or the like. In some embodiments, the logic circuitry 275 can be configured to transmit an indication of the serial high logic values and low logic values stored in the filler bank 280 in response to receiving a high logic value or a low logic value from the controller 270. For example, when the filler bank 280 initially stores a value of "0 0 1 1" and receives a logic high value changing the value to "0 1 1 1," the logic circuitry 275 can transmit an indication of the new queue depth (such as by transmitting the "0 1 1 1" value) to a terminal. The logic circuitry 275 can be configured to provide the status of the data occupancy level of the memory 210 at any depth level, from empty to full.

The logic circuitry 275 can further be configured to provide a flag indicating a full filler bank condition (such as 100%) when the most significant bit (MSB) of the filler bank 280 stores a value of one (which occurs when the filler bank 280 stores a value of "1 1 1 1"). Additionally, a half-full condition flag can be provided, such as by using the output value of a flip-flop in mid position of the filler bank 280. In addition, the logic circuitry 275 can be configured to provide a flag indicating an empty filler bank condition (such as 0%) when the least significant bit (LSB) of the filler bank 280 is zero (which occurs when the filler bank 280 stores a value of "0 0 0 0"). A full flag, half-full flag, or empty flag can be transmitted from the logic circuitry 275 to a terminal or any other suitable destination(s).

Although FIG. 2 illustrates one example of a filler bank control circuit 200 for synchronous FIFO queues, various changes may be made to FIG. 2. For example, various components in FIG. 2 could be combined, further subdivided, or rearranged and additional components could be added according to particular needs.

Figure 3A:
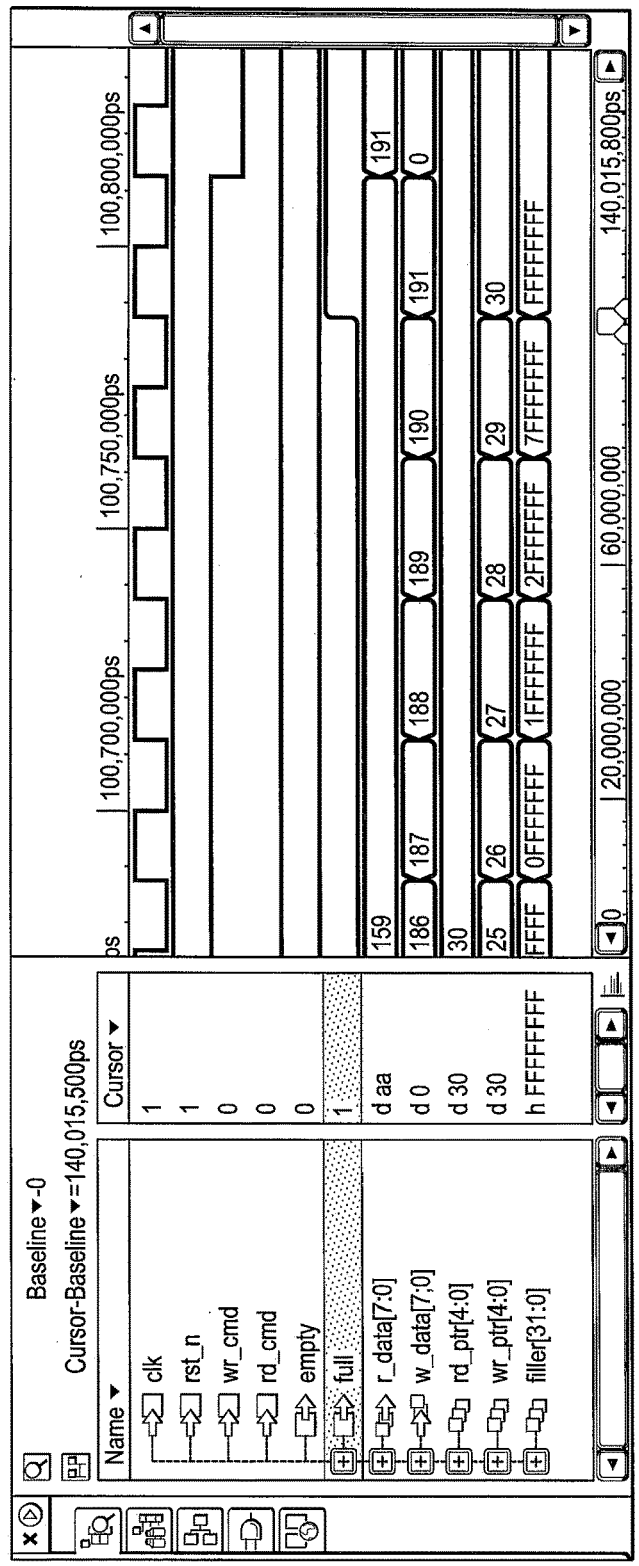
FIGS. 3A and 3B illustrate examples of timing diagrams associated with the filler bank control circuit for synchronous FIFO queues according to this disclosure.
Figure 3B:
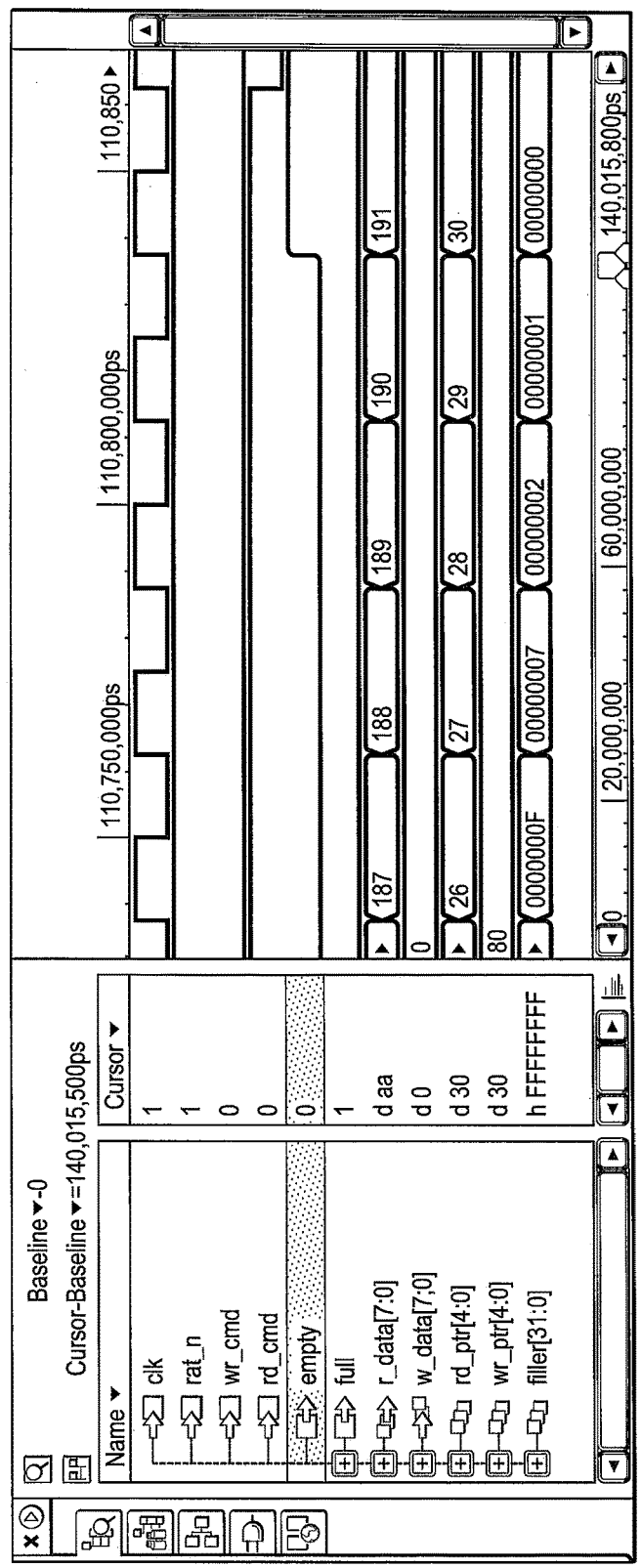

FIGS. 3A and 3B illustrate examples of timing diagrams associated with the filler bank control circuit 200 for synchronous FIFO queues according to this disclosure. More specifically, FIG. 3A illustrates an example timing diagram when the logic circuitry 275 transmits a full indication (such as after a write operation), and FIG. 3B illustrates an example timing diagram when the logic circuitry 275 transmits an empty condition (such as after a read operation).

Table 1 below is an example comparison between a conventional memory control circuit for a synchronous FIFO memory and the filler bank control circuit 200 for synchronous FIFO queues. For Table 1, a synchronous clock period of 4068 ps (245 MHz) is used.

TABLE 1

| | Conventional FIFO Memory with depth of 32 | Filler Bank control for synchronous FIFO queues with depth of 32 |
| --- | --- | --- |
| Slack on Clock | 1303.08 ps | 2343.77 ps |
| Maximum Frequency | 361.67 MHz | 579.96 MHz |

As shown in Table 1, the filler bank control circuit 200 has a greater maximum frequency than the conventional FIFO memory.

Although FIGS. 3A and 3B illustrate examples of timing diagrams associated with the filler bank control circuit 200 for synchronous FIFO queues, various changes may be made to FIGS. 3A and 3B. For example, the timing diagrams illustrate example operations of a specific filler bank control circuit 200. Other implementations of the filler bank control circuit 200 need not operate in the same manner.

Figure 4:
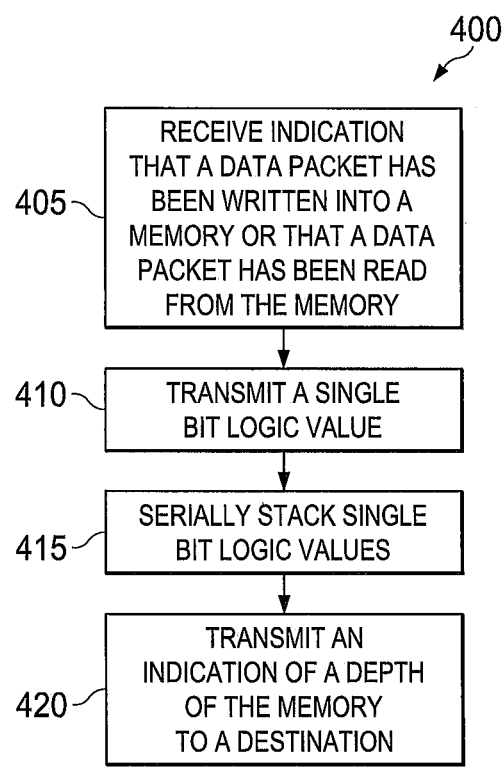
FIG. 4 illustrates an example method for operating a filler bank control circuit for synchronous FIFO queues according to this disclosure.

FIG. 4 illustrates an example method 400 for operating a filler bank control circuit for synchronous FIFO queues according to this disclosure. For ease of explanation, the method 400 is described with respect to the filler bank control circuit 200 of FIG. 2. The method 400 could be used by any other suitable filler bank control circuit.

As shown in FIG. 4, a controller receives an indication that a data packet has been written into a memory or that a data packet has been read from the memory at step 405. This could include, for example, the controller 270 receiving an indication from one of the counters 225-230. The controller transmits a single-bit logic value to logic circuitry in response to the received indication at step 410. This could include, for example, the controller 270 transmitting a "1" or high logic value to the logic circuitry 275 in response to receiving an indication from the write counter 225. This could also include the controller 270 transmitting a "0" or low logic value to the logic circuitry 275 in response to receiving an indication from the read counter 230.

The logic circuitry controls the serial stacking of single-bit logic values received from the controller based on the most recent single-bit logic value at step 415. This could include, for example, the logic circuitry 275 causing the filler bank 280 to perform a left-shift operation and inserting a "1" value into the LSB of the filler bank 280 in response to receiving a "1" value from the logic circuitry 275. This could also include the logic circuitry 275 causing the filler bank 280 to perform a right-shift operation and inserting a "0" value into the MSB of the filler bank 280 in response to receiving a "0" value from the logic circuitry 275. The arrangement of the single-bit logic values in the filler bank 280 is indicative of the current depth of the memory 210. Note that, as described above, the logic circuitry 275 could refrain from shifting the filler bank 280 upon a determination that an even number of reads and writes have occurred within a given time period.

The logic circuitry can transmit an indication of the current depth of the memory to a terminal or other destination(s) at step 420. This could be done in response to a change to the filler bank 280, the filler bank 280 showing a specified depth level, on demand, or in any other suitable manner.

Although FIG. 4 illustrates one example of a method 400 for operating a filler bank control circuit 200 for synchronous FIFO queues, various changes may be made to FIG. 4. For example, while shown as a series of steps, various steps in each figure could overlap, occur in parallel, occur in a different order, or occur multiple times.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus for controlling memory devices comprising:
 a controller configured to generate a first value indicating that a data packet has been written into a memory and a second value indicating that a data packet has been read from the memory; and
 logic circuitry configured to shift a plurality of single bit data values in a first direction in response to receiving the first value, and to shift the plurality of single bit data values in a second direction in response to receiving the second value.

2. The apparatus of claim 1, wherein:
 the first value represents a logic high value; and
 the second value represents a logic low value.

3. The apparatus of claim 1, further comprising:
 a shift memory bank configured to store the single-bit logic values;
 wherein the logic circuitry is configured to serially stack the single-bit logic values in the shift memory bank.

4. The apparatus of claim 3, wherein:
 the shift memory bank comprises multiple slots, each slot configured to store one single-bit logic value;
 a number of slots in the shift memory bank is indicative of a number of levels within the memory where data packets can be written into and read from; and
 an arrangement of the single-bit logic values in the shift memory bank is indicative of a current depth or data occupancy of the memory.

5. The apparatus of claim 3, wherein the logic circuitry is configured, in response to one single-bit logic value having the first value, to shift the single-bit logic values in the shift memory bank in a first direction towards a first end of the shift memory bank and insert the one single-bit logic value at a second end of the shift memory bank.

6. The apparatus of claim 5, wherein the logic circuitry is configured, in response to the one single-bit logic value having the second value, to shift the single-bit logic values in the shift memory bank in a second direction towards the second end of the shift memory bank and insert the one single-bit logic value at the first end of the shift memory bank.

7. The apparatus of claim 1, wherein the controller is further configured to:
 receive, within a specified amount of time, a first indication that a data packet has been written into the memory and a second indication that a data packet has been read from the memory; and
 refrain from transmitting single-bit logic values associated with the first and second indications to the logic circuitry.

8. The apparatus of claim 1, wherein the logic circuitry is further configured to transmit an indication identifying a current depth or data occupancy of the memory based on the single-bit logic values.

9. The apparatus of claim 1, further comprising:
 a write counter configured to detect when a data packet is written into the memory and generate a first indication; and a read counter configured to detect when a data packet is read from the memory and generate a second indication;
 wherein the controller is configured to generate the single-bit logic values based on the first and second indications.

10. A method for controlling memory devices comprising:
 generating a first value indicating that a data packet has been written into a memory and a second value indicating that a data packet has been read from the memory;
 shifting, with logic circuitry, a plurality of single bit data values in a first direction in response to receiving the first value; and
 shifting, with the logic circuitry, the plurality of single bit data values in a second direction in response to receiving the second value.

11. The method of claim 10, wherein:
 the first value represents a logic high value; and
 the second value represents a logic low value.

12. The method of claim 10, wherein the single-bit logic values are serially stacked in a shift memory bank.

13. The method of claim 12, wherein:
 the shift memory bank comprises multiple slots, each slot configured to store one single-bit logic value;
 a number of slots in the shift memory bank is indicative of a number of levels within the memory where data packets can be written into and read from; and
 an arrangement of the single-bit logic values in the shift memory bank is indicative of a current depth or data occupancy of the memory.

14. The method of claim 12, wherein serially stacking the single-bit logic values comprises:
 in response to one single-bit logic value having the first value, shifting the single-bit logic values in the shift memory bank in a first direction towards a first end of the shift memory bank and inserting the one single-bit logic value at a second end of the shift memory bank.

15. The method of claim 14, wherein serially stacking the single-bit logic values further comprises:
 in response to the one single-bit logic value having the second value, shifting the single-bit logic values in the shift memory bank in a second direction towards the second end of the shift memory bank and inserting the one single-bit logic value at the first end of the shift memory bank.

16. The method of claim 10, further comprising:
 receiving, within a specified amount of time, at least one first indication that at least one data packet has been written into the memory and at least one second indication that at least one data packet has been read from the memory; and
 refraining from generating single-bit logic values associated with the first and second indications.

17. The method of claim 10, further comprising:
 transmitting an indication identifying a current depth or data occupancy of the memory based on the single-bit logic values.

18. The method of claim 10, further comprising:
 detecting when a data packet is written into the memory and generating a first indication; and
 detecting when a data packet is read from the memory and generating a second indication;
 wherein the single-bit logic values are generated based on the first and second indications.

* * * * *